United States Patent [19]

Horvath et al.

[11] Patent Number: 5,428,567

[45] Date of Patent: Jun. 27, 1995

[54] MEMORY STRUCTURE TO MINIMIZE ROUNDING/TRUNCTION ERRORS FOR N-DIMENSIONAL IMAGE TRANSFORMATION

[75] Inventors: Thomas A. Horvath, Stormville; Min-Hsiung Lin; Gee-Gwo Mei, both of Yorktown Heights, all of N.Y.

[73] Assignee: International Business Machines Corporation, Armonk, N.Y.

[21] Appl. No.: 239,668

[22] Filed: May 9, 1994

[51] Int. Cl.[6] .................. G06F 15/332; G06F 7/38
[52] U.S. Cl. ........................... 365/78; 364/725; 364/745; 364/726; 382/232; 382/276
[58] Field of Search ............... 365/182, 185, 78; 382/41, 56; 364/725, 745, 726

[56] References Cited

U.S. PATENT DOCUMENTS

| | | | |
|---|---|---|---|
| 4,589,084 | 5/1986 | Fling et al. | 364/745 |
| 4,760,543 | 7/1988 | Ligtenberg et al. | 364/725 |
| 4,829,465 | 5/1989 | Knauer et al. | 364/725 |
| 5,177,704 | 1/1993 | D'Luna | 365/78 |
| 5,218,563 | 6/1993 | Juri et al. | 364/745 |

*Primary Examiner*—Viet Q. Nguyen
*Attorney, Agent, or Firm*—Whitham, Curtis, Whitham & McGinn; Richard Ludwin

[57] ABSTRACT

A method for computing n-dimensional decomposable image transformation using the 1D approach with constrained transpose memory provides a minimized rounding/truncation error. The method minimizes transpose memory size required to fulfill a defined accuracy requirement for n-dimensional image transformation. A set of input data elements are stored. Then, a first transform, of the multiple dimension transform, is performed on the set of input data elements so as to form an array of transformed data elements, each of the transformed data elements having a larger number of bits than the input data elements. A common range of the transformed data elements is determined, and a minimum number of bits required to represent the common range without loss of information is then determined. The memory word size available for storage of the transformed data elements is compared with a minimum number of bits so as to determine an excess number of bits. Only the excess number of bits of the transformed data is truncated/rounded so as to form an output set of data elements. Finally, the output set of data elements is stored.

7 Claims, 4 Drawing Sheets

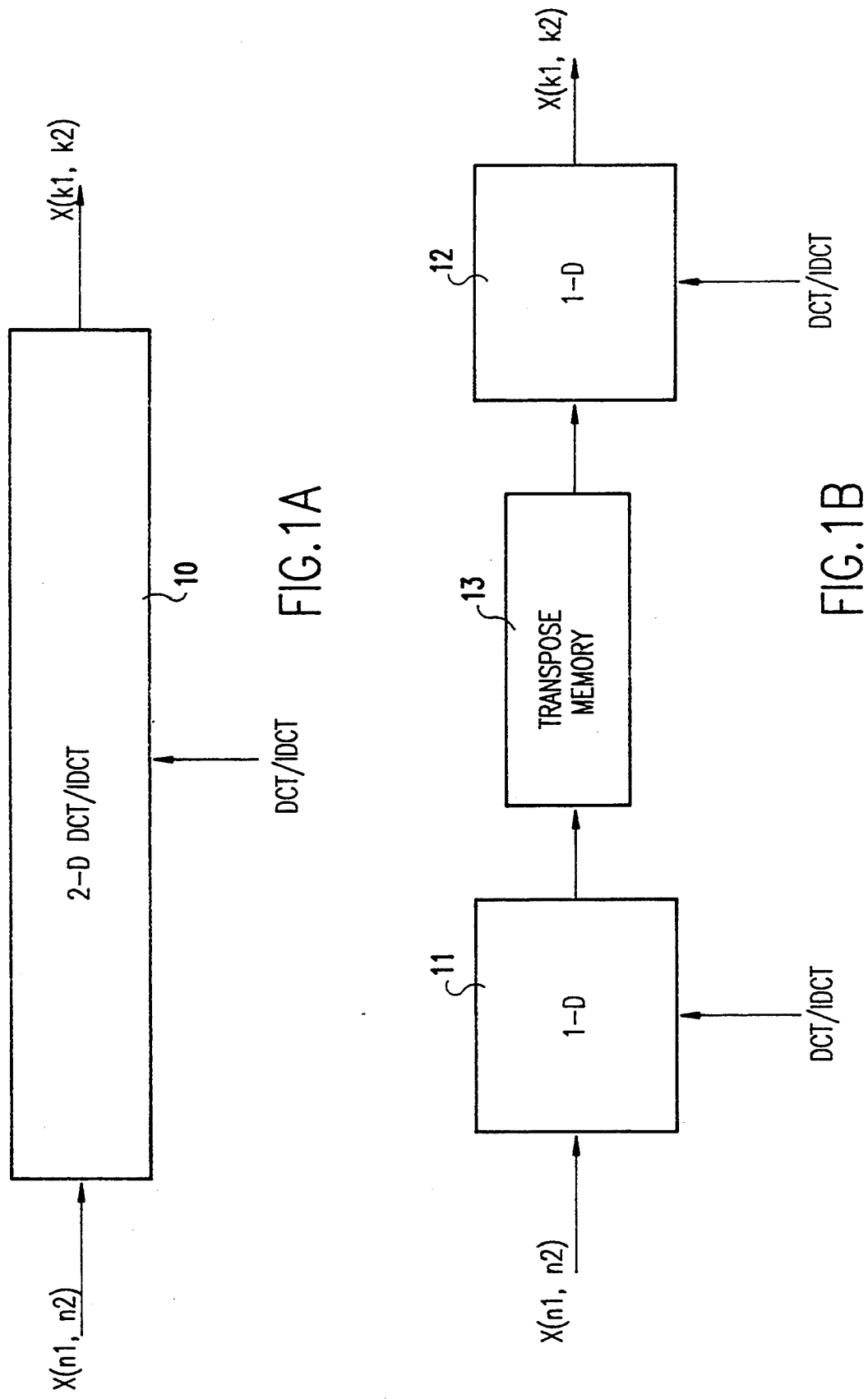

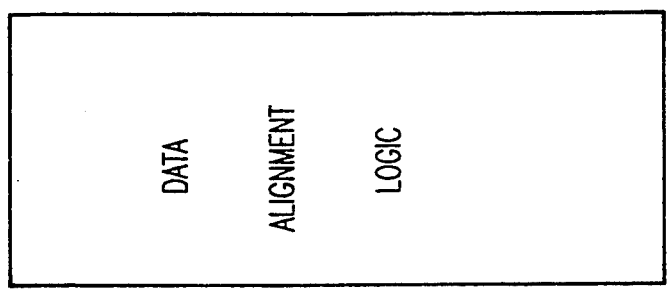
FIG.2D
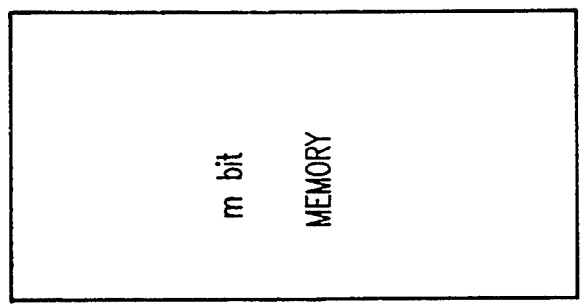
FIG.2C
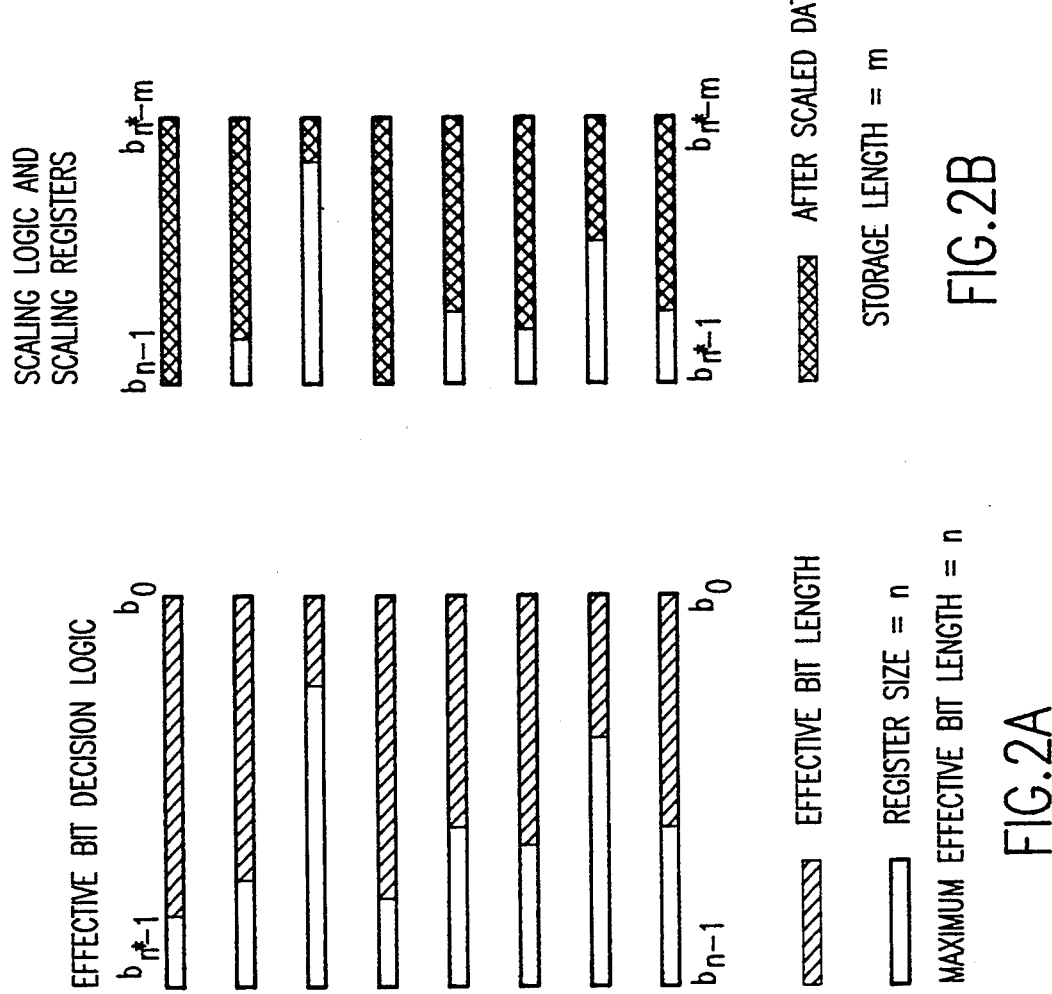
FIG.2B
FIG.2A

MEMORY STRUCTURE TO MINIMIZE ROUNDING/TRUNCTION ERRORS FOR N-DIMENSIONAL IMAGE TRANSFORMATION

BACKGROUND OF THE INVENTION

1. Field of the Invention

The present invention generally relates to memory architectures for use in image processing and, more particularly, to a novel memory architecture to achieve minimal rounding and truncation errors for n-dimensional image transformation.

2. Environment

Technological advances in digital transmission networks, digital storage media, and digital signal processing, especially of video signals, now make possible the economical transmission and storage of digital video in a wide variety of applications. Because the storage and transmission of digital video signals is central to many applications, and because an uncompressed representation of a video signal requires a large amount of storage, the use of digital video signal compression techniques is vital to this advancing art. In this regard, several international standards for the compression of digital video signals have emerged, and more are currently under development. These standards apply to algorithms for the transmission and storage of compressed digital video in a variety of applications, including videotelephony and teleconferencing, high quality digital television on coaxial and fiber-optic networks as well as broadcast terrestrially and over direct broadcast satellites, and various media such as compact disk read only memory (CD-ROM), digital audio tape (DAT) and magnetic and magnetooptical disks.

Many n-dimensional image transformations, such as the Discrete Cosine Transform (DCT) and the Fast Fourier Transform (FFT), are widely used in image processing. For example, a two-dimensional DCT (2D-DCT) is widely used in the field of image compression as a method to transform the image to a more compact form. Accordingly, the Joint Photographic Experts Group (JPEG) draft International Standards Organization (ISO) standard 10918-1, the Comité Consultif Internationale Télégraphique et Téléphone (CCITT) recommendation H.261 and the Moving Pictures Experts Group (MPEG) ISO/IEC (International Standards Organization/International Electrotechnical Commission) standard 13818-2 standardizes the DCT as their most computation intensive core to compress and decompress image data. However, for applications such as MPEG, the tolerance for computation error is very low because any erroneous image data may be reused over and over again. This explains why the Institute of Electronic and Electrical Engineers (IEEE) CAS Standards Committee submitted the standard proposal P1180 to specify the limitation of error for the implementation of $8 \times 8$ Inverse DCT.

Because of the decomposable feature of these transformations, consecutive one-dimensional (1D) transformations can be used to perform the n-dimensional transformations. The intermediate results after 1D transformation are normally stored in temporary memory devices before the following 1D transformation starts. For example, this 1D approach can be used to compute the 2D-DCT. That is, to implement 2D-DCT, first a 1D-DCT is performed based on row/column order, the intermediate results are saved and transposed, then a second 1D-DCT is performed, again based on row/column order. All of the intermediate results after the 1D-DCT coefficients are stored in memory. For a typical $8 \times 8$ 2D-DCT, this means a storage size of $8 \times 8 \times$ data size per intermediate 1D-DCT result (e.g., 16-bit).

The data size per intermediate 1D-DCT result is crucial in two ways. First, the size directly ties to physical area if it is desired to implement the memory in Very Large Scale Integrated (VLSI) circuit chips, especially if more expensive memory devices are used to implement transposition as well. Second, the size also ties directly to the throughput especially when Distributed Architecture (DA) is used to implement inner product computation. However, it is still necessary to meet the high accuracy requirement of the Draft Standard Specification for the implementations of $8 \times 8$ Inverse DCT (P1180) proposed by the IEEE CAS Standards Committee. There is need for a better way to satisfy the strict standard requirement without increasing hardware cost. In other words, a good memory architecture is needed to effectively utilize the intermediate computation storage that can avoid bits dropping.

3. Description of the Prior Art

A brief summary of published articles which describe a number of schemes of adaptive quantization and bit-rate control may be found in U.S. Pat. No. 5,231,484 to Gonzales et al. assigned to the International Business Machines Corp. The Gonzales et al. patent discloses a specific system which implements an encoder suitable for use with the proposed ISO/IEC MPEG standards. This system operates to adaptively pre-process an incoming digital motion video sequence, allocate bits to the pictures in a sequence, and adaptively quantize transform coefficients in different regions of a picture in a video sequence so as to provide optimal visual quality given the number of bits allocated to that picture. Gonzales et al. however do not address the need for a memory architecture to effectively utilize the intermediate computation storage that can avoid bits dropping in a transform such as the DCT/IDCT transform.

The architecture proposed by Darren Slawecki and Weiping Li, "DCT/IDCT Processor Design for High Data Rate Image Coding", *IEEE Transactions on Circuits and Systems for Video Technology*, Vol. 2, No. 2, June 1992, simply drops the least significant bits generated in a transform computation. This approach, however, cannot satisfy the strict standard requirements without increasing hardware cost; that is, a larger memory is required (and a longer processing time is required for the second dimension operation) in order to provide the accuracy necessary to satisfy the standards.

SUMMARY OF THE INVENTION

It is therefore an object of the present invention to provide a minimized rounding or truncation error for computing n-dimensional decomposable image transformation using the 1D approach with constrained transpose memory.

It is another object of the invention to provide a minimized transpose memory size required to fulfill a defined accuracy requirement for n-dimensional image transformation.

According to the invention, there is provided a method for minimizing rounding and truncation errors in the storage of multiple dimension transform data. A set of input data elements is stored. Then, a first transform, of the multiple dimension transform, is performed on the set of input data elements so as to form an array of transformed data elements, each of the transformed data elements having a larger number of bits than the input data elements. A common range of the transformed data elements is determined, and a minimum number of bits required to represent the common range without loss of information is then determined. The memory word size available for storage of the transformed data elements is compared with a minimum number of bits so as to determine an excess number of bits. Only the excess number of bits of the transformed data is truncated so as to form an output set of data elements. Finally, the output set of data elements is stored.

BRIEF DESCRIPTION OF THE DRAWINGS

The foregoing and other objects, aspects and advantages will be better understood from the following detailed description of a preferred embodiment of the invention with reference to the drawings, in which:

FIG. 1A is a high level block diagram showing an example of the conversion of data from the time domain to the frequency domain in a 2D DCT/IDCT transformation circuit;

FIG. 1B is block diagram showing the decomposition of the 2-D DCT/IDCT transformation circuit in FIG. 1A into to two 1-D DCTs with an intermediate transpose memory in accordance the practice of the invention;

FIGS. 2A to 2D are schematic diagrams showing the principles of operation of the dynamically data scalable memory architecture (DDSMA) according to the invention;

DETAILED DESCRIPTION OF A PREFERRED EMBODIMENT OF THE INVENTION

Figure 3:
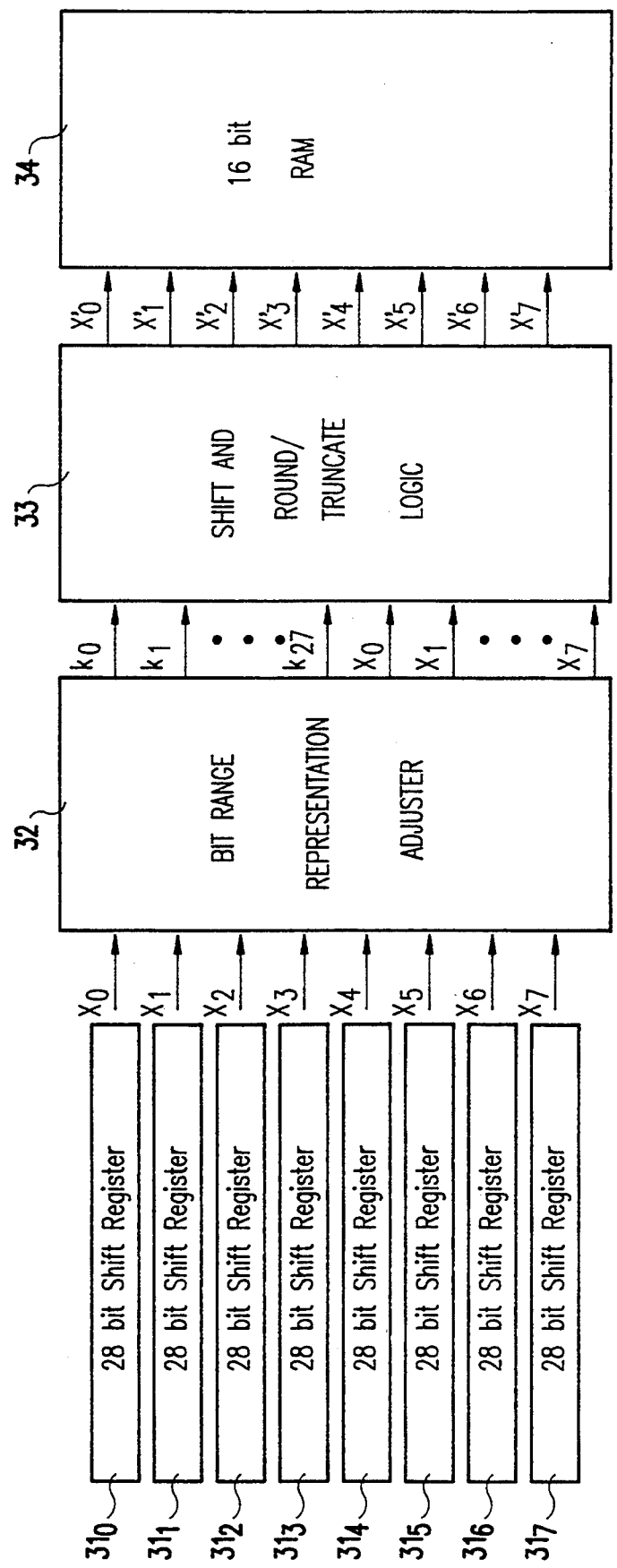
FIG. 3 is a block diagram showing an implementation of the functions of FIGS. 2A to 2C of the dynamically data scalable memory architecture (DDSMA) according to the invention.

Referring now to the drawings, and more particularly to FIG. 1A, there is shown in functional block diagram form a two dimensional direct cosine transform/inverse direct cosine transform (2-D DCT/IDCT) circuit 10 which receives data $x(n_1,n_2)$ in the time domain and converts this data to data $X(k_1,k_2)$ in the frequency domain. This is accomplished by successive multiplications according to the DCT algorithm, details of which are not important to the present invention. For more information on the DCT/IDCT transformation, see for example the article by Slawecki et al., supra.

FIG. 1B shows the implementation of the 2D DCT/IDCT transformation 10 by two consecutive one-dimensional (1D) transformation circuits 11 and 12, and it will be understood that this approach can be used to perform n-dimensional transformations. The intermediate results after the first 1D transformation are stored in transpose memory 13 before the following 1D transformation starts. Thus, for this example, the 2D-DCT is implemented by a first 1D-DCT performed by circuit 11 based on row/column order, the intermediate results saved in transpose memory 13, then a second 1D-DCT performed by circuit 12, based on column/row order. It is the architecture of the transpose memory to which the present invention is addressed.

FIGS. 2A to 2D schematically show the functions of the new memory architecture according to the invention, herein referred to as dynamically data scalable memory architecture (DDSMA), which achieves minimal rounding or truncation errors for n-dimensional image transformation. The cost of implementing the architecture is just a small add on to the original storage structure. The additional added on logic is to dynamically scale input data to fully utilize every bit in the constrained memory to avoid bit dropping. The added on hardware are scaling logic and data alignment logic shown in FIGS. 2B and 2D, respectively.

The memory architecture shown in FIG. 2A includes effective bit decision logic function which performs the minimum bit representation transformation. The input data can be represented as integer or floating point. However, the input to the DDSMA comes as a set of columns or rows with the same range. Each column or row may have its own range. For example, in FIG. 1B, in order to compute the 2D DCT/IDCT, the data going to the transpose memory 13 are either in row or column order. Returning to FIG. 2A, the effective bit decision logic tunes each row or column data within the same range. To maintain high accuracy during the 1D DCT computation, normally the input data are larger than the ones needed to be stored in the transpose memory 13.

In FIG. 2B, the scaling logic function of the DDSMA trims down the data size without losing too much accuracy. Since each row or column data are represented with different scaling factors, the data needs to be realigned with the same scale before the data can be used for the computation that follows.

In FIG. 2C, the m-bit memory stores the scaled data plus the after scaled data adjuster factor. For each set of data, the adjuster factor will be the same, but for different sets of data, the adjuster factor will vary. Therefore, the data alignment logic function shown in FIG. 2D aligns the data in memory to align several sets of data in memory 13.

FIG. 3 shows a specific implementation of the functions of FIGS. 2A to 2D. The input comprises data stored in eight 28-bit shift registers $31_0$ to $31_7$ storing data $x_0$ to $x_7$ resulting from a 1D DCT/IDCT transformation operation. The data from the registers $31_0$ to $31_7$ are input to a bit range representation adjuster 32, the purpose of which is to determine the number of redundant bits in the data. Assume, for example, that the data $x_0$ to $x_7$ is as follows in decimal and binary notation:

$x_0 = -2595344 = 1111110110000110010111110000$ $x_1 = -3648214 = 1111110010000101010100101010$ $x_2 = -4629866 = 1111101100010101101010010110$ $x_3 = 1470795 = 0000000101100111000101001011$ $x_4 = 1244669 = 0000000100101111110111111101$ $x_5 = -353142 = 1111111110101001100100001010$ $x_6 = -220230 = 1111111111001010001110111010$ $x_7 = 1408844 = 0000000101010111111101001100$

In the binary notation, the first or most significant bits (MSBs) are the sign, and additional redundant bits are padded to fill the registers. In the example above, the first four bits for each binary number are redundant.

Only one sign bit is needed, so the first step in data compaction is the elimination of the first four bits by the bit range representation logic 32.

Figure 4:
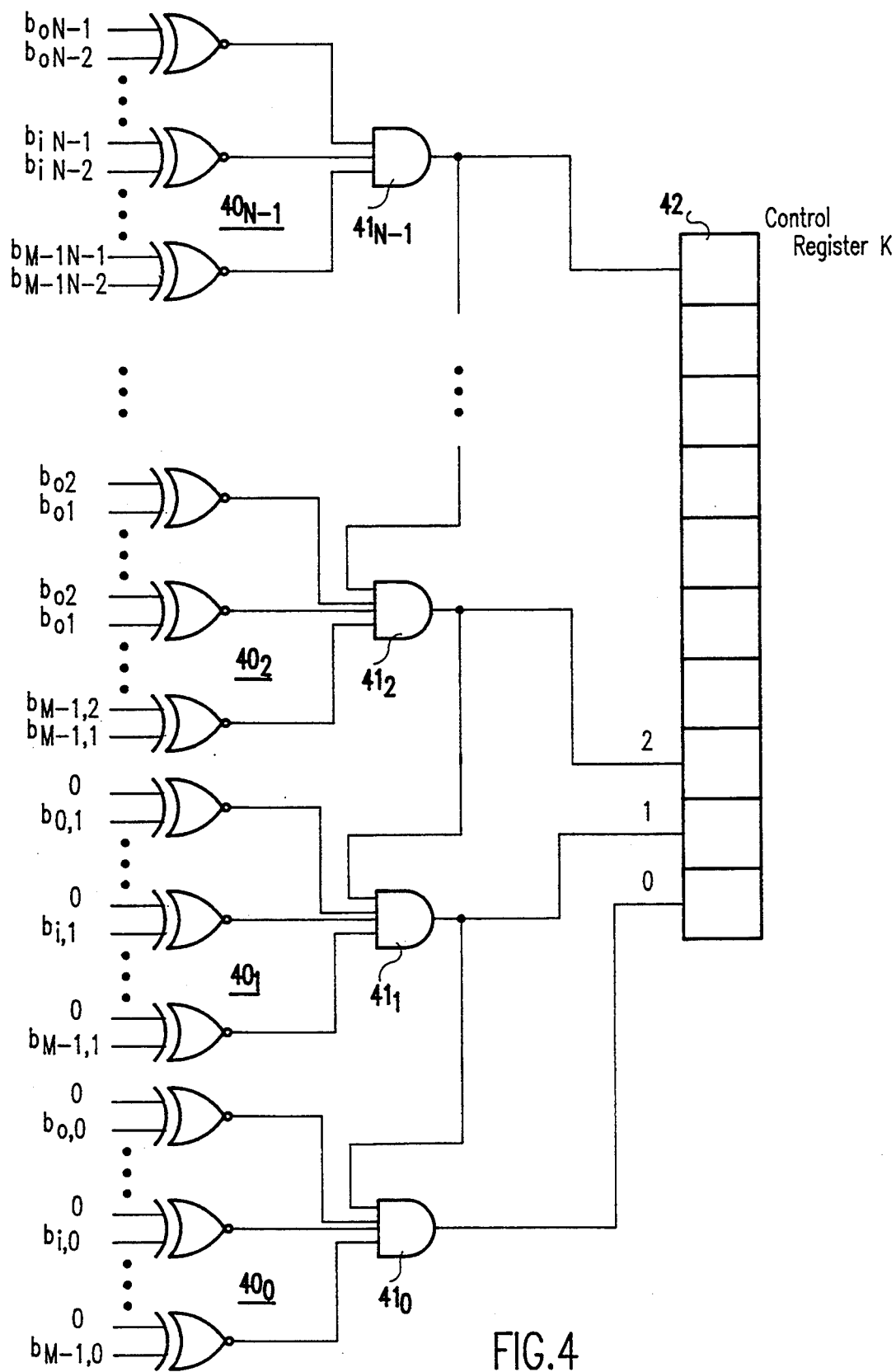
FIG. 4 is a logic diagram showing an example of the bit range representation adjuster shown in FIG. 3.

FIG. 4 shows the bit range representation logic 32 which comprises N arrays $40_0$ to $40_{N-1}$ of M exclusive NOR gates, where N is the number of bits in the input shift registers $30_0$ to $30_7$ (in our example N=28) and M is number of shift registers (in our example M=8). The exclusive NOR gates of the first array $40_0$ compare the MSB and second MSB of each of the shift registers, the exclusive NOR gates of the second array $40_1$ compare the second and third MSBs of each shift register, and so forth. The outputs of the exclusive NOR gates of each array are input to a corresponding AND gate $41_0$ to $41_{N-1}$. Moreover, the output of the first AND gate $41_0$ is input the next AND gate $41_1$ and so forth. In effect, the logic provides an output "1" at each AND gate until a transition is detected between successive bits in the data of one of the shift registers. In the example above, this occurs between the fifth and sixth bits of data $x_2$. Thus, the output of AND gate $41_4$ will be a "0", and this propagates to all succeeding AND gates. The outputs of the several AND gates is stored in a control register 42, and for our example above, the content, K, of the control register 42 is $K = 1111000000000000000000000000000$ which is output to the shift and round/truncate logic 33 in FIG. 3.

Returning now to FIG. 3, each set of data $x_0$ to $x_7$ is passed to the shift and round/truncate logic 33 from the bit range representation adjuster logic 32 along with the corresponding content $k_i$, $k=0,1,\ldots,n$, of the control register for that set of data. In our example, n=27. The shift and truncate logic 33 first drops any redundant bits in accordance with the content of the control register. In the specific example above, the first four bits of the data $x_0$ to $x_7$ are dropped by shifting to the left. Then, the data is rounded/truncated to drop the necessary additional low order bits to conform the data to a specific bit length. For example, if the maximum bit length is sixteen, an additional eight low order bits are dropped after first dropping the redundant bits. One way this can be done by shifting to the right sixteen bits after first shifting left by four bits. For the example above, the resulting data $x'_0$ to $x'_7$ is as follows in decimal and binary notation:

$x'_0 = -10139 = 1101100001100101$ $x'_1 = -14251 = 1100100001010101$ $x'_2 = -18086 = 1011100101011010$ $x'_3 = 5745 = 0001011001110001$ $x'_4 = 4861 = 0001001011111101$ $x'_5 = -1380 = 1111101010011100$ $x'_6 = -861 = 1111110010100011$ $x'_7 = 5503 = 0001010101111111$

This process is continued for each set of data with the bit range adjustment for each set stored in memory 34. Since the bit range adjustment is not going to be the same for each set of data, it will become necessary to align the data. Take for example the following results for bit-range adjuster values and the corresponding shift round/truncate values:

| bit-range adjuster | shift truncate | alignment |
|---|---|---|
| 4 | 8 | 2 → 10 |
| 3 | 9 | 1 → 10 |
| 2 | 10 | 0 → 10 |
| 4 | 8 | 2 → 10 |
| 5 | 7 | 3 → 10 |
| 3 | 9 | 1 → 10 |
| 2 | 10 | 0 → 10 |
| 4 | 8 | 2 → 10 |

Thus, in this example, the alignment is accomplished in the data alignment logic of FIG. 2D by shifting to the right the number of places indicated so that the data for each of the several sets is aligned.

The more precise definition of these functions are described as follows.

Definition 0: The Scaling Operation is defined to scale a set of input row or column data X with maximum effective bit length n* significant bit represented as $(b_{n^*-1}, b_{n^*-2}, \ldots, b_0)$ to X' according to a set of m bit output according to the following rule:

| case 1: $(b_{n^*-1} b_{n^*-2}, \ldots, b_0)$ | to $(0,0, \ldots, b_{n^*-1}, b_{n^*-2}, \ldots, b_0)$ if $m \geq n^*$, |
|---|---|
| case 2: | to $(b_{n^*-1}, b_{n^*-2}, \ldots, b_{n^*-m})$ otherwise. |

The size of scaling is defined to be 1 in case 1 and $n^* - m$ in case 2.

Definition 1: The Scaling Register is defined to store the encoded size of scaling defined in Definition 0.

Definition 2: The Scaling Logic takes M inputs, namely $X_0, X_1, \ldots, X_{M-1}$ and generates scaled outputs $X'_0, X'_1, \ldots, X'_{M-1}$ according to the Scaling operation defined in Definition 0.

Since each row/column may be scaled differently before storing into the intermediate memory 13, a data alignment logic 24 may be needed before the data reaches the following 1D transformation unit. For the DCT and FFT case, this operation aligns the transposed data to the same scaling factor. The alignment logic 24 is defined for the image transformation, such as DCT and FFT, in the following Definitions 3 and 4. The data inputs $Y_0, Y_1, \ldots, Y_{M-1}$ are transposed data read from the memory devices. The data inputs which are scaled differently after the scaling logic requires to be aligned to a common scaling factor before the following 1D transformation starts.

Definition 3: The Alignment Operation is defined to align M inputs, namely $Y_0, Y_1, \ldots, Y_{M-1}$ to $Y'_0, Y'_1, \ldots, Y'_{M-1}$ according to a normalized factor N. The scaling factors associated with these inputs are defined to be $S_0, S_1, \ldots, S_{M-1}$. For each $Y_i$, the output $$Y'_i = \frac{Y_i}{2^{N-S_i}}.$$

The selection of the normalization factor N can be based on the set of scaling factors $S_0, S_1, \ldots, S_{M-1}$. For example, N can be the maximum number of the scaling factors $S_0, S_1, \ldots, S_{M-1}$.

Table 1 describes the data coming out of the first 1D-DCT computation.

TABLE 1

| | \multicolumn{8}{c}{AFTER 1-D-DCT AND BEFORE SCALING} |
| | 1 | 2 | 3 | 4 | 5 | 6 | 7 | 8 |
|---|---|---|---|---|---|---|---|---|
| 1 | −2595344 | −3648214 | −4629866 | 1470795 | 1244669 | −353142 | −220230 | 1408844 |
| 2 | 3823087 | 1093873 | −5855 | −4803491 | −1609595 | −2859939 | −2538115 | 468789 |
| 3 | 3461928 | 2404995 | 2773491 | −338082 | 787102 | −2769313 | −995633 | 4916992 |
| 4 | −870483 | −1003698 | −3323311 | −2830174 | 1117448 | −2768003 | 1093460 | −2445119 |
| 5 | −2511450 | −1569894 | 2958357 | 2003732 | −2528358 | −2396273 | −173886 | 3012948 |
| 6 | −1175382 | 4364853 | −316692 | −605216 | 1852426 | 3890368 | −1757531 | 4701264 |
| 7 | −1661282 | −205100 | 1472739 | −3252116 | 1649094 | −981493 | 5321494 | −2389680 |
| 8 | 240865 | −1199441 | −2141487 | 319411 | 4159427 | 2479689 | 2274731 | −1174555 |

Definition 4: The Alignment Logic 24 takes M inputs, namely $Y_0, Y_1, \ldots, Y_{M-1}$ and normalized factor N to generate outputs $Y'_0, Y'_1, \ldots, Y'_{M-1}$ based on Definition 3.

An example is used to illustrate the working process of the architecture. The following five tables describe the date flow at five different states for a 2D-DCT computation using this architecture.

Table 2 describes the data coming out after the scaling operation as defined in Definition 0. The scaled data as well as the scaling factors are listed.

TABLE 2

| | \multicolumn{8}{c}{AFTER SCALING} | |
| | 1 | 2 | 3 | 4 | 5 | 6 | 7 | 8 | Scaling Factor |
|---|---|---|---|---|---|---|---|---|---|
| 1 | −10138 | −14250 | −18085 | 5745 | 4861 | −1379 | −860 | 5503 | 8 |
| 2 | 14933 | 4272 | −22 | −18763 | −6287 | −11171 | −9914 | −1831 | 8 |
| 3 | 13523 | 9394 | 10833 | −1320 | 3074 | −10817 | −3889 | 19207 | 8 |
| 4 | −6800 | −7841 | −25963 | −22110 | 8730 | −21625 | 8542 | −19102 | 7 |
| 5 | −19620 | −12264 | 23112 | 15654 | −19752 | −18720 | −1358 | 23538 | 7 |
| 6 | 4591 | −17050 | −1237 | −2364 | 7236 | 15196 | −6865 | 18364 | 8 |
| 7 | −6489 | −801 | 5752 | −12703 | 6441 | −3833 | 20787 | −9334 | 8 |
| 8 | 1881 | −9370 | −16730 | 2495 | 32495 | 19372 | 17771 | −9176 | 7 |

Table 3 describes the data coming out after the alignment operation according to Definition 3.

TABLE 3

| | \multicolumn{8}{c}{AFTER ALIGNMENT} |
| | 1 | 2 | 3 | 4 | 5 | 6 | 7 | 8 |
|---|---|---|---|---|---|---|---|---|
| 1 | −10138 | −14250 | −18085 | 5745 | 4861 | −1379 | −860 | 5503 |
| 2 | 14933 | 4272 | −22 | −18763 | −6287 | −11171 | −9914 | −1831 |
| 3 | 13523 | 9394 | 10833 | −1320 | 3074 | −10817 | −3889 | 19207 |
| 4 | −3400 | −3920 | −12981 | −11055 | 4365 | −10812 | 4271 | −9551 |
| 5 | −9810 | −6132 | 11556 | 7827 | −9876 | −9360 | −679 | 11769 |
| 6 | 4591 | −17050 | −1237 | −2364 | 7236 | 15196 | −6865 | 18364 |
| 7 | −6489 | −801 | 5752 | −12703 | 6441 | −3833 | 20787 | −9334 |
| 8 | 940 | −4685 | −8365 | 1247 | 16247 | 9686 | 8885 | −4588 |

Table 4 describes equivalent floating point representation for the data shown in Table 3.

TABLE 4

| | \multicolumn{8}{c}{EQUIVALENT FLOATING POINT PRECISION} |
| | 1 | 2 | 3 | 4 | 5 | 6 | 7 | 8 |
|---|---|---|---|---|---|---|---|---|
| 1 | −158.406 | −222.656 | −282.579 | 89.766 | 75.953 | −21.547 | −13.438 | 85.984 |
| 2 | 233.328 | 66.750 | −0.344 | −293.172 | −98.234 | −174.547 | −154.906 | −28.609 |
| 3 | 211.297 | 146.781 | 169.266 | −20.625 | 48.031 | −169.016 | −60.766 | 300.109 |
| 4 | −53.125 | −61.250 | −202.828 | −172.734 | 68.203 | −168.938 | 66.734 | −149.234 |
| 5 | −153.281 | −95.813 | 180.563 | 122.297 | −154.313 | −146.250 | −10.610 | 183.891 |
| 6 | −71.734 | −266.406 | −19.328 | −36.938 | 113.063 | 237.438 | −107.266 | 286.938 |
| 7 | −101.391 | −12.516 | 89.875 | −198.484 | 100.641 | −59.891 | 324.797 | −145.844 |
| 8 | 14.688 | −73.203 | −130.703 | 19.494 | 253.859 | 151.344 | 138.828 | −71.688 |

Table 5 describes the 2D-DCT computation results.

TABLE 5

| | \multicolumn{8}{c}{FINAL RESULT} |
| | 1 | 2 | 3 | 4 | 5 | 6 | 7 | 8 |
|---|---|---|---|---|---|---|---|---|
| 1 | 42 | −121 | −43 | −196 | 50 | −224 | −39 | 203 |
| 2 | 219 | 174 | −107 | −16 | −129 | −175 | −220 | −28 |
| 3 | 1 | −87 | −111 | −91 | 175 | 169 | 132 | −96 |
| 4 | −188 | −229 | −19 | 117 | −175 | 85 | −189 | 178 |
| 5 | −189 | −127 | −244 | 128 | 37 | −24 | 104 | −208 |
| 6 | −179 | −71 | −198 | −107 | 63 | −72 | 189 | −223 |
| 7 | −48 | −196 | −238 | 169 | 218 | 254 | −106 | 208 |

TABLE 5-continued

| FINAL RESULT | | | | | | | |
|---|---|---|---|---|---|---|---|
| 1 | 2 | 3 | 4 | 5 | 6 | 7 | 8 |
| 8 | −106 | 27 | 162 | 251 | −23 | −74 | 90 | 209 |

Based on this example, the architecture of the present invention was compared with the architecture proposed by Darren Slawecki and Weiping Li, supra. The following test results were generated according to the procedures defined in the proposed IEEE P1180 standard. There different architectures that implement the Inverse Discrete Cosine Transform (IDCT) are compared.

TABLE 6

TEST RESULTS

| | | | Proposed Standard Specification | Slawecki's Architecture | Dynamic Bit-Representation with DDSMA |
|---|---|---|---|---|---|
| −256⇌+255 | Data I | Max_Peak | 1 | 2 | 1 |
| | | Max_PMSE | 0.06 | 0.4471000 | 0.0100000 |
| | | Max_PME | 0.015 | 0.3905000 | 0.0030000 |
| | | OMSE | 0.02 | 0.3423344 | 0.0079406 |
| | | OME | 0.0015 | 0.1693781 | 0.0000437 |
| | Data II | Max_Peak | 1 | 2 | 1 |
| | | Max_PMSE | 0.06 | 0.4459000 | 0.0099000 |
| | | Max_PME | 0.015 | 0.3889000 | 0.0021000 |
| | | OMSE | 0.02 | 0.3418937 | 0.0081000 |
| | | OME | 0.0015 | 0.1684656 | 0.0001687 |
| −300⇌+300 | Data I | Max_Peak | 1 | 2 | 1 |
| | | Max_PMSE | 0.06 | 0.3860000 | 0.0102000 |
| | | Max_PME | 0.015 | 0.3352000 | 0.0019000 |
| | | OMSE | 0.02 | 0.29066094 | 0.0075609 |
| | | OME | 0.0015 | 0.1440453 | 0.0000766 |
| | Data II | Max_Peak | 1 | 2 | 1 |
| | | Max_PMSE | 0.06 | 0.3827000 | 0.0097000 |
| | | Max_PME | 0.015 | 0.3345000 | 0.0026000 |
| | | OMSE | 0.02 | 0.2902781 | 0.0076594 |
| | | OME | 0.0015 | 0.1433031 | 0.0002469 |
| −5 ~ +5 | Data I | Max_Peak | 1 | 2 | 1 |
| | | Max_PMSE | 0.06 | 0.4100000 | 0.0006000 |
| | | Max_PME | 0.015 | 0.3406000 | 0.0004000 |
| | | OMSE | 0.02 | 0.3338078 | 0.0001959 |
| | | OME | 0.0015 | 0.1483859 | 0.0000016 |
| | Data II | Max_Peak | 1 | 2 | 1 |
| | | Max_PMSE | 0.06 | 0.4240000 | 0.0007000 |
| | | Max_PME | 0.015 | 0.3520000 | 0.0003000 |
| | | OMSE | 0.02 | 0.3349187 | 0.0001844 |
| | | OME | 0.0015 | 0.1497156 | 0.0000031 |

The foregoing test results show that Slawecki's architecture fails the IEEE P1180 tests. In contrast, the architecture according to the present invention, i.e., dynamic bit-representation with DDSMA, is significantly better that the other two architectures with the same size intermediate register and transpose memory. It also exceeds the proposed IEEE P1180 standard. Especially when the input data are small ($-5 \rightleftharpoons +5$), the architecture according to the invention has almost perfect results.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for minimizing rounding/truncation errors in the storage of multiple dimension transform data, comprising the steps of:
    (a) storing a set of input data elements;
    (b) performing a first transform, of the multiple dimension transform, on the set of input data elements so as to form an array of transformed data elements, each of the transformed data elements having a larger number of bits than the input data elements;
    (c) determining a common range of the transformed data elements;
    (d) determining a minimum number of bits required to represent the common range without loss of information;
    (e) comparing the memory word size available for storage of the transformed data elements with a minimum number of bits so as to determine an excess number of bits;
    (f) rounding or truncating only the excess number of bits of the transformed data so as to form an output set of data elements; and
    (g) storing the output set of data elements.

2. The method recited in claim 1 further comprising the step of performing a second transformation, of the multiple dimension transform, on the output set of data elements and said set of input data elements so as to form a second array of transformed data elements and then repeating the steps (c) to (g) inclusive.

3. The method recited in claim 1 wherein the steps (a) through (g) are performed for a plurality of sets of input data elements, said method further comprising of aligning the output sets of data elements for each set of the input data elements.

4. A memory architecture which minimizes rounding/truncation errors in the storage of multiple dimension transform data comprising:

first storage means for temporarily storing an array of transformed data elements, each of the transformed data elements having a larger number of bits than that of an input set of data elements;

a bit range representation adjuster connected to receive said array of transformed data elements from said first storage means for determining a common range of the transformed data elements;

shift and round/truncate logic connected to said bit range representation adjuster for first determining a minimum number of bits required to represent the common range without loss of information and shifting said data array to said minimum number of bits and second rounding or truncating low order bits of said minimum number of bits so as to reduce the array to a memory word size available for storage; and second storage means for receiving and storing the rounded/truncated array of data.

5. The memory architecture recited in claim 4 wherein said bit range representation adjuster comprises logic which successively compares first and second, second and third, third and fourth, and so forth leading bits of each of said transformed data elements stored in said first storage means, said logic stopping the comparison when a transition in logic level is detected in any of the comparisons.

6. A multiple dimensional image data transformation system comprising:

means for storing a set of input image data elements;

a plurality of one dimensional transformation circuits, a first one of the transformation circuits being connected to said means for storing to receive said set of input image data elements and performing a transformation operation to produce an array of transformed data elements, each of the transformed data elements having a larger number of bits than the input data elements;

a transpose memory between each pair of one dimensional transformation circuits, each said transpose memory comprising:

first storage means for temporarily storing an array of transformed data elements, each of the transformed data elements having a larger number of bits than an input set of data elements;

a bit range representation adjuster connected to receive said array of transformed data elements from said first storage means for determining a common range of the transformed data elements;

shift and round/truncate logic connected to said bit range representation adjuster for first determining a minimum number of bits required to represent the common range without loss of information and shifting said data array to said minimum number of bits and second rounding or truncating low order bits of said minimum number of bits so as to reduce the array to a memory word size available for storage; and second storage means for receiving and storing the rounded/truncated array of data;

each transformation circuit after the first transformation circuit being connected to said means for storing to receive said set of input image data elements and to a preceding transpose memory to receive rounded/truncated array data and performing a transformation operation to produce another array of transformed data elements, each of the transformed data elements having a larger number of bits than the input data elements.

7. The multiple dimensional image data transformation system recited in claim 6 wherein said bit range representation adjuster comprises logic which successively compares first and second, second and third, third and fourth, and so forth leading bits of each of said transformed data elements stored in said first storage means, said logic stopping the comparison when a transition in logic level is detected in any of the comparisons.

* * * * *